(12) United States Patent
Arima et al.

(10) Patent No.: US 7,779,339 B2
(45) Date of Patent: Aug. 17, 2010

(54) ACS CIRCUIT

(75) Inventors: Yukio Arima, Osaka (JP); Akira Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 881 days.

(21) Appl. No.: 10/591,457

(22) PCT Filed: Dec. 15, 2004

(86) PCT No.: PCT/JP2004/018724

§ 371 (c)(1),
(2), (4) Date: Sep. 1, 2006

(87) PCT Pub. No.: WO2005/112275

PCT Pub. Date: Nov. 24, 2005

(65) Prior Publication Data

US 2007/0200739 A1      Aug. 30, 2007

(30) Foreign Application Priority Data

May 14, 2004   (JP)   .............................. 2004-144450

(51) Int. Cl.
*H03M 13/03*   (2006.01)
(52) U.S. Cl. ..................... 714/796; 714/752; 714/758
(58) Field of Classification Search ................. 714/796, 714/752, 758
See application file for complete search history.

(56) References Cited

U.S. PATENT DOCUMENTS 5,410,555 A * 4/1995 Itakura et al. ............... 714/795
5,953,383 A * 9/1999 Kojima ....................... 375/347
6,483,881 B1 * 11/2002 Kim et al. .................... 375/341
7,165,210 B2 * 1/2007 Nieminen .................... 714/792
2003/0043939 A1 * 3/2003 Okumura et al. ............ 375/341

FOREIGN PATENT DOCUMENTS

JP     10-233702 A    9/1998
JP     3258174 B2    12/2001

OTHER PUBLICATIONS

Yamamoto et al., A 500MHZ, 50 mW Viterbi detector for DVD systems using simplified ACS and new path memory architecture, Symposium on VLSI circuits digest of technical papers. IEEE Jun. 2002, pp. 256-259.*

Akira Yamamoto et al., "A 500MHz 50mW Viterbi Detector for DVD Systems Using Simplified ACS and New Path Memory Architecture," Symposium on VLSI Circuits Digest of Technical Papers, Jun. 13-15, 2002, pp. 256-259.

* cited by examiner

*Primary Examiner*—Sam Rizk
(74) *Attorney, Agent, or Firm*—McDermott Will & Emery LLP

(57) ABSTRACT

An ACS circuit includes: a basic DPM retaining section (11) for retaining basic DPMs (differential path metrics); a basic DPM calculating section (12) for calculating the basic DPMs; a reference DPM calculating section (13) for calculating reference DPMs, which are DPMs other than the basic DPMs; a basic DBM calculating section (14) for calculating basic DBMs (differential branch metrics), which are DBMs necessary for calculating the basic DPMs; and a path selecting section (15) for selecting the most likely paths for Viterbi decoding in accordance with the basic DPMs, the reference DPMs and the basic DBMs. The basic DPM calculating section (12) calculates new basic DPMs in accordance with the basic DPMs, the reference DPMs, the basic DBMs, and the results of the most likely path selection by the path selecting section (15).

8 Claims, 9 Drawing Sheets

FIG. 6(a)

DPM01(k)

| DBM | DPM(k-1) | SPN0 | SPN1 |
|---|---|---|---|
| b01-b00 | 0 | 0 | 0 |
| b21-b00 | DPM02 | 0 | 1 |
| b41-b00 | DPM04 | 0 | 2 |
| b61-b00 | DPM06 | 0 | 3 |
| b01-b20 | -DPM02 | 1 | 0 |
| b21-b20 | 0 | 1 | 1 |
| b41-b20 | DPM24 | 1 | 2 |
| b61-b20 | DPM26 | 1 | 3 |
| b01-b40 | -DPM04 | 2 | 0 |
| b21-b40 | -DPM24 | 2 | 1 |
| b41-b40 | 0 | 2 | 2 |
| b61-b40 | DPM46 | 2 | 3 |
| b01-b60 | -DPM06 | 3 | 0 |
| b21-b60 | -DPM26 | 3 | 1 |
| b41-b60 | -DPM46 | 3 | 2 |
| b61-b60 | 0 | 3 | 3 |

FIG. 6(b)

DPM02(k)

| DBM | DPM(k-1) | SPN0 | SPN2 |
|---|---|---|---|
| b02-b00 | 0 | 0 | 0 |
| b22-b00 | DPM02 | 0 | 1 |
| b42-b00 | DPM04 | 0 | 2 |
| b62-b00 | DPM06 | 0 | 3 |
| b02-b20 | -DPM02 | 1 | 0 |
| b22-b20 | 0 | 1 | 1 |
| b42-b20 | DPM24 | 1 | 2 |
| b62-b20 | DPM26 | 1 | 3 |
| b02-b40 | -DPM04 | 2 | 0 |
| b22-b40 | -DPM24 | 2 | 1 |
| b42-b40 | 0 | 2 | 2 |
| b62-b40 | DPM46 | 2 | 3 |
| b02-b60 | -DPM06 | 3 | 0 |
| b22-b60 | -DPM26 | 3 | 1 |
| b42-b60 | -DPM46 | 3 | 2 |
| b62-b60 | 0 | 3 | 3 |

FIG. 6(c)

DPM03(k)

| DBM | DPM(k-1) | SPN0 | SPN3 |
|---|---|---|---|
| b03-b00 | 0 | 0 | 0 |
| b23-b00 | DPM02 | 0 | 1 |
| b43-b00 | DPM04 | 0 | 2 |
| b63-b00 | DPM06 | 0 | 3 |
| b03-b20 | -DPM02 | 1 | 0 |
| b23-b20 | 0 | 1 | 1 |
| b43-b20 | DPM24 | 1 | 2 |
| b63-b20 | DPM26 | 1 | 3 |
| b03-b40 | -DPM04 | 2 | 0 |
| b23-b40 | -DPM24 | 2 | 1 |
| b43-b40 | 0 | 2 | 2 |
| b63-b40 | DPM46 | 2 | 3 |
| b03-b60 | -DPM06 | 3 | 0 |
| b23-b60 | -DPM26 | 3 | 1 |
| b43-b60 | -DPM46 | 3 | 2 |
| b63-b60 | 0 | 3 | 3 |

FIG. 6(d)

DPM04(k)

| DBM | DPM(k-1) | SPN0 | SPN4 |
|---|---|---|---|
| b14-b00 | DPM01 | 0 | 0 |
| b34-b00 | DPM03 | 0 | 1 |
| b54-b00 | DPM05 | 0 | 2 |
| b74-b00 | DPM07 | 0 | 3 |
| b14-b20 | -DPM12 | 1 | 0 |
| b34-b20 | DPM23 | 1 | 1 |
| b54-b20 | DPM25 | 1 | 2 |
| b74-b20 | DPM27 | 1 | 3 |
| b14-b40 | -DPM14 | 2 | 0 |
| b34-b40 | -DPM34 | 2 | 1 |
| b54-b40 | DPM45 | 2 | 2 |
| b74-b40 | DPM47 | 2 | 3 |
| b14-b60 | -DPM16 | 3 | 0 |
| b34-b60 | -DPM36 | 3 | 1 |
| b54-b60 | -DPM56 | 3 | 2 |
| b74-b60 | DPM67 | 3 | 3 |

FIG. 6(e)

DPM05(k)

| DBM | DPM(k-1) | SPN0 | SPN5 |
|---|---|---|---|
| b15-b00 | DPM01 | 0 | 0 |
| b35-b00 | DPM03 | 0 | 1 |
| b55-b00 | DPM05 | 0 | 2 |
| b75-b00 | DPM07 | 0 | 3 |
| b15-b20 | -DPM12 | 1 | 0 |
| b35-b20 | DPM23 | 1 | 1 |
| b55-b20 | DPM25 | 1 | 2 |
| b75-b20 | DPM27 | 1 | 3 |
| b15-b40 | -DPM14 | 2 | 0 |
| b35-b40 | -DPM34 | 2 | 1 |
| b55-b40 | DPM45 | 2 | 2 |
| b75-b40 | DPM47 | 2 | 3 |
| b15-b60 | -DPM16 | 3 | 0 |
| b35-b60 | -DPM36 | 3 | 1 |
| b55-b60 | -DPM56 | 3 | 2 |
| b75-b60 | DPM67 | 3 | 3 |

FIG. 6(f)

DPM06(k)

| DBM | DPM(k-1) | SPN0 | SPN6 |
|---|---|---|---|
| b16-b00 | DPM01 | 0 | 0 |
| b36-b00 | DPM03 | 0 | 1 |
| b56-b00 | DPM05 | 0 | 2 |
| b76-b00 | DPM07 | 0 | 3 |
| b16-b20 | -DPM12 | 1 | 0 |
| b36-b20 | DPM23 | 1 | 1 |
| b56-b20 | DPM25 | 1 | 2 |
| b76-b20 | DPM27 | 1 | 3 |
| b16-b40 | -DPM14 | 2 | 0 |
| b36-b40 | -DPM34 | 2 | 1 |
| b56-b40 | DPM45 | 2 | 2 |
| b76-b40 | DPM47 | 2 | 3 |
| b16-b60 | -DPM16 | 3 | 0 |
| b36-b60 | -DPM36 | 3 | 1 |
| b56-b60 | -DPM56 | 3 | 2 |
| b76-b60 | DPM67 | 3 | 3 |

FIG. 6(g)

DPM07(k)

| DBM | DPM(k-1) | SPN0 | SPN7 |
|---|---|---|---|
| b17-b00 | DPM01 | 0 | 0 |
| b37-b00 | DPM03 | 0 | 1 |
| b57-b00 | DPM05 | 0 | 2 |
| b77-b00 | DPM07 | 0 | 3 |
| b17-b20 | -DPM12 | 1 | 0 |
| b37-b20 | DPM23 | 1 | 1 |
| b57-b20 | DPM25 | 1 | 2 |
| b77-b20 | DPM27 | 1 | 3 |
| b17-b40 | -DPM14 | 2 | 0 |
| b37-b40 | -DPM34 | 2 | 1 |
| b57-b40 | DPM45 | 2 | 2 |
| b77-b40 | DPM47 | 2 | 3 |
| b17-b60 | -DPM16 | 3 | 0 |
| b37-b60 | -DPM36 | 3 | 1 |
| b57-b60 | -DPM56 | 3 | 2 |
| b77-b60 | DPM67 | 3 | 3 |

ACS CIRCUIT

RELATED APPLICATIONS

This application is the U.S. National Phase under 35 U.S.C. §371 of International Application No. PCT/JP2004/018724, filed on Dec. 15, 2004, which in turn claims the benefit of Japanese Application No. 2004-144450, filed on May 14, 2004, the disclosures of which Applications are incorporated by reference herein.

TECHNICAL FIELD

The present invention relates to ACS circuits for performing additions and comparisons of path metrics and making path selections for Viterbi decoding. More particularly, the present invention relates to an ACS circuit for making path selections in accordance with metric differences.

BACKGROUND ART

Viterbi decoding is a technique in which a data sequence encoded by a certain convolution operation is received and then the received data is decoded by predicting the most suitable data sequence according to the rules of the convolution operation. Rules of a convolution operation can be described as a state transition diagram. And if time concept is added to the state transition diagram, a trellis diagram can be described.

FIG. 9 shows the structure of a convolution encoder typically used in Gigabit Ethernet (Ethernet: trademark). The convolution encoder, which includes delay elements 101, 102, and 103 and adders 104 and 105, is a 2-bit input, 8-state convolution encoder. The delay elements 101, 102, and 103 delay an input value by one clock and output the delayed value. The adder 104 adds the output of the delay element 101 and the higher-order bit of input data. The delay element 102 receives the result of the addition from the adder 104. The adder 105 adds the output of the delay element 102 and the lower-order bit of the input data. The delay element 103 receives the result of the addition from the adder 105. And the delay element 101 receives the output of the delay element 103. By this process, the delay elements 101 to 103 indicate 3-bit states, i.e., 8 states.

FIG. 10 is a trellis diagram for the convolution encoder. The trellis diagram shows transitions occurring with respect to states S0, S1, S2, S3, S4, S5, S6, and S7 from time (k−1) to time k and from the time k to time (k+1). The lines connecting the states are called branches. Each branch connects one state to another which is a transition destination from that one state.

In Viterbi decoding, in order to evaluate the likelihood, i.e., the probability, of a transition from each state, a "branch metric" is calculated for each branch by using an evaluation function. A branch metric is usually calculated as a square error between an ideal value and an actually received value. On the other hand, for each state, the cumulative sum of the branch metrics for the most likely branches of all branches that can reach that state is stored from the start of the decoding. This sum value is called a path metric. In Viterbi decoding, a branch for which the result of adding the path metric at the time (k−1) and the branch metric at the time k is the smallest is determined as the most likely branch. That is, an ACS circuit is an Add-Compare-Select circuit which performs additions of the path metrics at the time (k−1) and the branch metrics at the time k, compares the results of the additions, and selects the most likely branches, so as to determine the most likely branches.

Paths created by connecting the most likely branches obtained at each time are called survivor paths. In the trellis diagram, each state has its own survivor path. However, as the decoding process proceeds, the survivor paths of all states converge into one. The one survivor path thus obtained is the final decoding result produced by the Viterbi decoding.

A conventional ACS circuit uses square calculations for calculating branch metrics. This causes a problem in that the circuit is complicated and an overflow occurs because each path metric is the sum total of the branch metrics. As a measure to prevent the occurrence of path metric overflows, a technique has been known, in which the values of path metrics are occasionally monitored and at a point in time when an overflow is likely to occur, the same value is subtracted from the path metric values of the respective states. In this technique, however, after the ordinal processing is performed by the ACS circuit, the overflow determination and the subtracting processing are necessary, causing decrease in the processing rate. Therefore, a technique has been developed, in which squared terms are deleted in the branch metric calculation by using differential branch metrics (hereinafter referred to as "DBMs"), each of which is a difference between branch metrics, thereby simplifying the calculation, while an overflow is avoided in the path metric calculation by using differential path metrics (hereinafter referred to as "DPMs"), each of which is a difference between path metrics (see Patent Document 1, for example).

Nevertheless, in the ACS circuit in which path selections are made according to the metric differences as described above, since a relatively large number of DPMs must be retained, a retaining circuit of relatively large size is required. For example, in the case of the 8-state trellis diagram, the number of path metrics is eight, while the number of DPMs is twenty-eight ($=_8C_2$). Therefore, in order to suppress the increase in the size of the retaining circuit, an ACS circuit in which the number of DPMs to be retained is limited has been developed (see Non-Patent Document 1, for example). This ACS circuit, however, uses typical branch metrics in addition to DBMs in calculating the DPMs and thus has a problem in that square calculations are necessary.

Patent Document 1: Japanese Patent No. 3258174 specifications

Non-Patent Document 1: Akira Yamamoto, et al, "A 500 MHz 50 mW Viterbi Detector for DVD Systems using Simplified ACS and New Path Memory Architecture", 2002 Symposium On VLSI Circuits Digest of Technical Papers, pp. 256-259

DISCLOSURE OF THE INVENTION

Problems that the Invention Intends to Solve

As described above, the conventional ACS circuit in which path selections are made according to metric differences has the problem of the increase in the circuit size. Now, for an ACS circuit for decoding a data sequence generated by a 2-bit input 8-state convolution encoder, a comparison in circuit size will be made between a case in which DPMs are used and a case in which DPMs are not used. The former case requires a retaining circuit for retaining 8 path metrics and 32 adders for performing additions of the path metrics and branch metrics. The number of adders is based on the fact that four branches coming from four states at the immediately previous time are connected to each of the eight states. Furthermore, in the former case, a circuit for preventing overflows is necessary in addition to these retaining circuit and adders. On the other hand, the latter case requires a retaining circuit for retaining 28 DPMs and 400 adders for performing additions of the DPMs and DBMs. The number of adders is based on the fact that the 16 DBMs are associated with each of the 28 DPMs. It should be noted that the number (48 in total) of adders into which a DPM having a value "0" is input is not counted.

As described above, the conventional ACS circuit in which path selections are made according to metric differences has a relatively high processing rate, but has the disadvantage of being extremely large in circuit size. The increase in the circuit size causes power consumption increase and hence manufacturing cost increase and is thus not preferable.

In view of the above problems, it is therefore an object of the present invention to suppress circuit size increase as much as possible in an ACS circuit for use in Viterbi decoding and to take a measure to prevent a path metric overflow occurring in the Viterbi decoding.

Means for Solving the Problems

In order to achieve the object, inventive means is an ACS circuit, which receives differential branch metrics (DBMs), each of which is a difference between any two branches related to Viterbi decoding, performs additions of the received DBMs to differential path metrics (DPMs), each of which is a difference between any two states, and compares resultant DPMs obtained after the additions to select the most likely paths, wherein of the DPMs, basic DPMs, each of which is a DPM between a path metric for a reference state and a path metric for another state, are retained and the most likely paths are selected according to the basic DPMs.

Then, all of the DPMs do not have to be retained and it is sufficient if just some of the DPMs, i.e., the basic DPMs are retained. Therefore, the size of the circuit for retaining the DPMs is relatively small. In addition, in the ACS circuit, the most likely paths are selected according to the metric differences. This eliminates path metric overflows without decreasing the processing rate.

Specifically, the ACS includes: a basic DPM retaining section for retaining the basic DPMs; a basic DPM calculating section for calculating the basic DPMs; a reference DPM calculating section for calculating reference DPMs, which are DPMs other than the basic DPMs and necessary for the basic DPM calculation by the basic DPM calculating section; a basic DBM calculating section for calculating basic DBMs of the DBMs, the basic DBMs being necessary for the basic DPM calculation by the basic DPM calculating section; and a path selecting section for selecting the most likely paths for the Viterbi decoding in accordance with the basic DPMs retained by the basic DPM retaining section, the reference DPMs calculated by the reference DPM calculating section, and the basic DBMs calculated by the basic DBM calculating section, wherein the basic DPM calculating section calculates new basic DPMs in accordance with the basic DPMs retained by the basic DPM retaining section, the reference DPMs calculated by the reference DPM calculating section, the basic DBMs calculated by the basic DBM calculating section, and results of the most likely path selection by the path selecting section.

Then, as to the DBMs, it is sufficient if just the basic DBMs, which are DBMs necessary for the basic DPM calculation, are calculated. Furthermore, as to the DPMs, it is sufficient if just the reference DPMs, which are DPMs necessary for the basic DPM calculation, are calculated in addition to the basic DPMs.

Preferably, the basic DBM calculation by the basic DBM calculating section and the reference DPM calculation by the reference DPM calculating section are performed by parallel processing.

Also, preferably, the reference DPM calculating section calculates each of the reference DPMs by subtracting one of the basic DPMs retained by the basic DPM retaining section from another.

Specifically, the basic DPM calculating section selects basic DPMs and basic DBMs, from which the new basic DPMs are calculated, from the basic DPMs retained by the basic DPM retaining section, the reference DPMs calculated by the reference DPM calculating section, and the basic DBMs calculated by the basic DBM calculating section, in accordance with the results of the most likely path selection by the path selecting section, and performs additions of the selected basic DPMs and the selected basic DBMs, thereby calculating the new basic DPMs.

Also, specifically, the basic DPM calculating section adds each of the basic DPMs retained by the basic DPM retaining section and the reference DPMs calculated by the reference DPM calculating section to each of the basic DBMs calculated by the basic DBM calculating section to thereby calculate candidates for the new basic DPMs and selects the new basic DPMs from the candidates in accordance with the results of the most likely path selection by the path selecting section.

Also, specifically, the path selecting section assigns different path selection numbers to branches related to transitions to states in the Viterbi decoding and outputs, as the results of the most likely path selection, a path selection signal indicating one of the path selection numbers.

EFFECTS OF THE INVENTION

As described above, according to the present invention, in an ACS circuit in which a path selection is made according to metric differences, a circuit for retaining DPMs is reduced in size. Moreover, it is sufficient if just a minimum necessary number of DBMs (basic DBMs) and DPMs (basic DPMs and reference DPMs) are calculated. Therefore, the number of adders and other computing elements that must be provided in the ACS circuit is relatively small. Consequently, the circuit size of the entire ACS circuit is small and power consumption and manufacturing costs are also reduced.

BRIEF DESCRIPTION OF DRAWINGS

FIG. 6 shows tables indicating rules for generating basic DPMs.

EXPLANATION OF THE REFERENCE CHARACTERS

11 Basic DPM retaining section
12 Basic DPM calculating section
13 Reference DPM calculating section
14 Basic DBM calculating section
15 Path selecting section

BEST MODE FOR CARRYING OUT THE INVENTION

Figure 10:
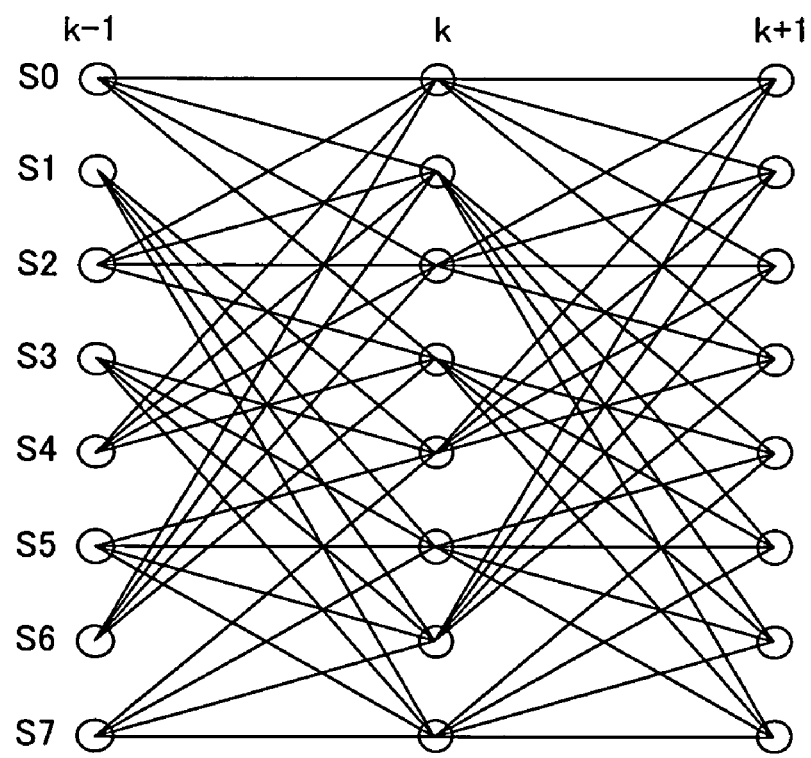
FIG. 10 is a trellis diagram for the convolution encoder shown in FIG. 9.

Hereinafter, preferred embodiments of the present invention will be described with reference to the accompanying drawings. For the sake of convenience, the following descriptions will be made assuming that Viterbi decoding based on the trellis diagram shown in FIG. 10 is performed. It should be noted that the present invention is not limited to the Viterbi decoding based on that trellis diagram.

First of all, the reference characters used in the following descriptions will be described. A branch metric will be denoted by "bij", which means a branch for making a transition from a state Si to a state Sj. For example, "b02" represents a branch for making a transition from a state S0 to a state S2. The reference character "DBMs" means general differential branch metrics. The reference character "DPMij" indicates a DPM between a path metric for the state Sj and a path metric for the state Si. For instance, if a path metric for the state S0 is PM0 and a path metric for the state S2 is PM2, $$DPM02=PM2-PM0.$$

The simply written reference character "DPMs" means general differential path metrics.

Figure 1:
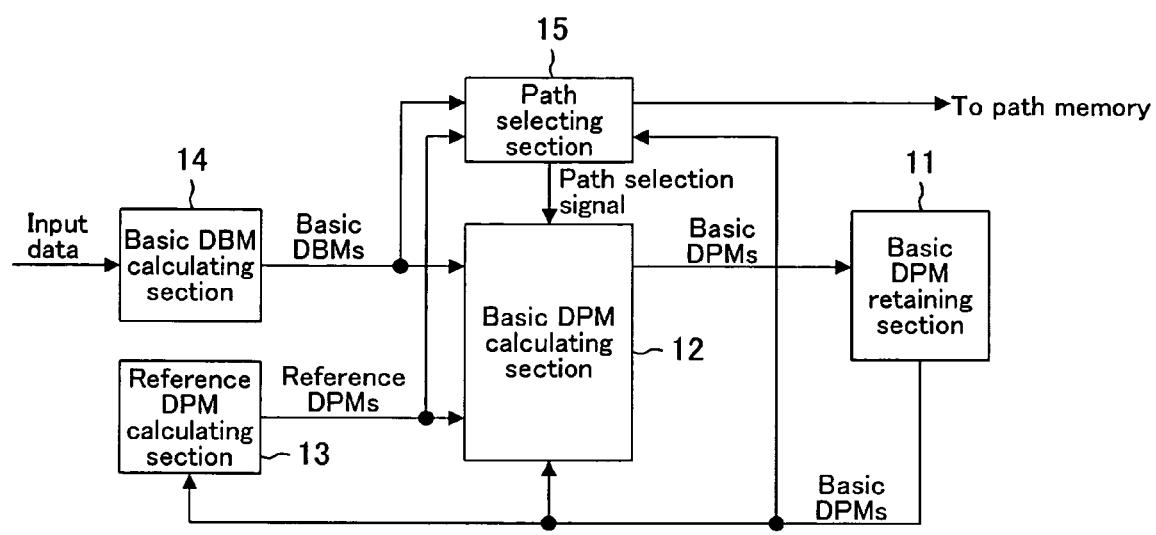
FIG. 1 shows the configuration of an ACS circuit according to a preferred embodiment of the present invention.

FIG. 1 shows the configuration of an ACS circuit according to a preferred embodiment of the present invention. The ACS circuit of this embodiment includes a basic DPM retaining section 11, a basic DPM calculating section 12, a reference DPM calculating section 13, a basic DBM calculating section 14, and a path selecting section 15. The basic DPM retaining section 11 retains basic DPMs, each of which is a differential path metric between a path metric for a reference state and a path metric for another state. The basic DPM calculating section 12 calculates the basic DPMs. The reference DPM calculating section 13 calculates reference DPMs, which are DPMs necessary for calculating the basic DPMs. The basic DBM calculating section 14 calculates basic DBMs, which are DBMs necessary for calculating the basic DPMs. The path selecting section 15 selects the most likely paths for the Viterbi decoding.

The basic DPM retaining section 11 retains DPM01, DPM02, DPM03 DPM04, DPM05, DPM06, and DPM07, as the basic DPMs. That is, the basic DPM retaining section 11 retains, as the basic DPM, each DPM between a reference state, which is the state S0, and another state.

Figure 2:
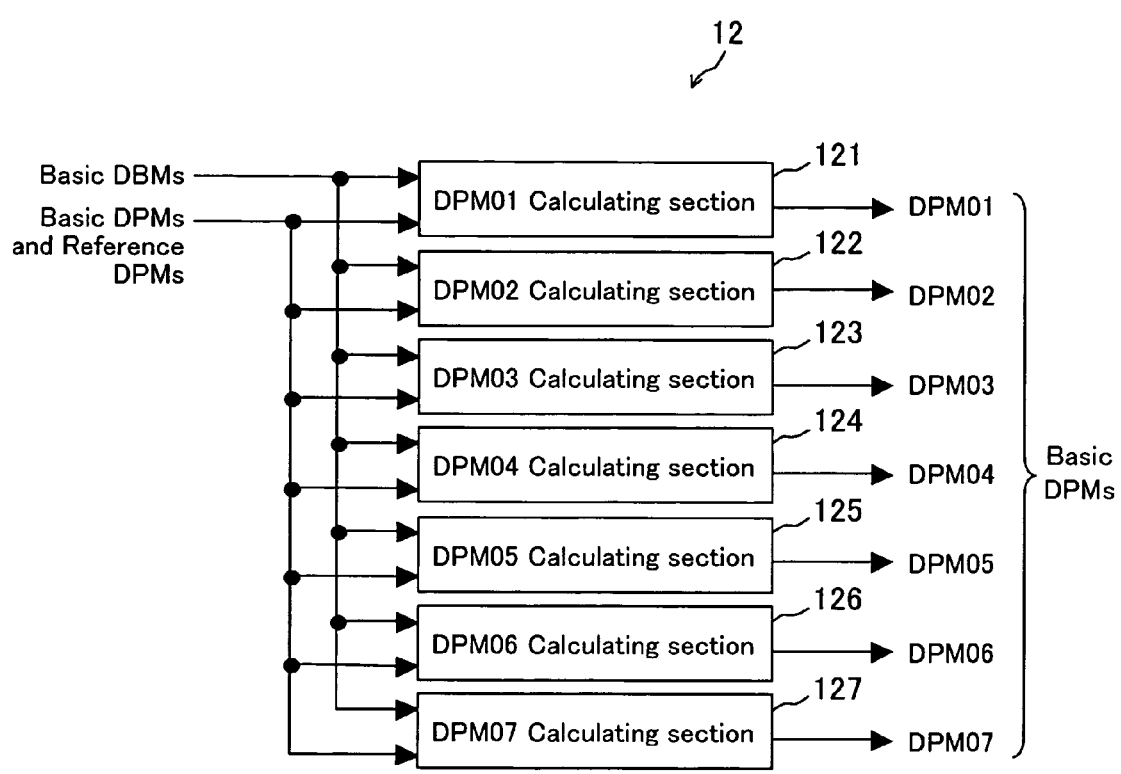
FIG. 2 illustrates the internal configuration of a basic DPM calculating section.

The basic DPM calculating section 12 newly calculates basic DPMs and outputs the calculated new basic DPMs to the basic DPM retaining section 11. FIG. 2 illustrates the internal configuration of the basic DPM calculating section 12. The basic DPM calculating section 12 includes a DPM01 calculating section 121, a DPM02 calculating section 122, a DPM03 calculating section 123, a DPM04 calculating section 124, a DPM05 calculating section 125, a DPM06 calculating section 126, and a DPM07 calculating section 127, which calculate DMP01, DMP02, DMP03, DMP04, DMP05, DMP06, and DMP07, respectively, each of which is a basic DPM, according to the basic DBMs calculated by the basic DBM calculating section 14, the basic DPMs retained in the basic DPM retaining section 11, and the reference DPMs calculated by the reference DPM calculating section. The configuration of these calculating sections will be described in detail later.

Figure 3:
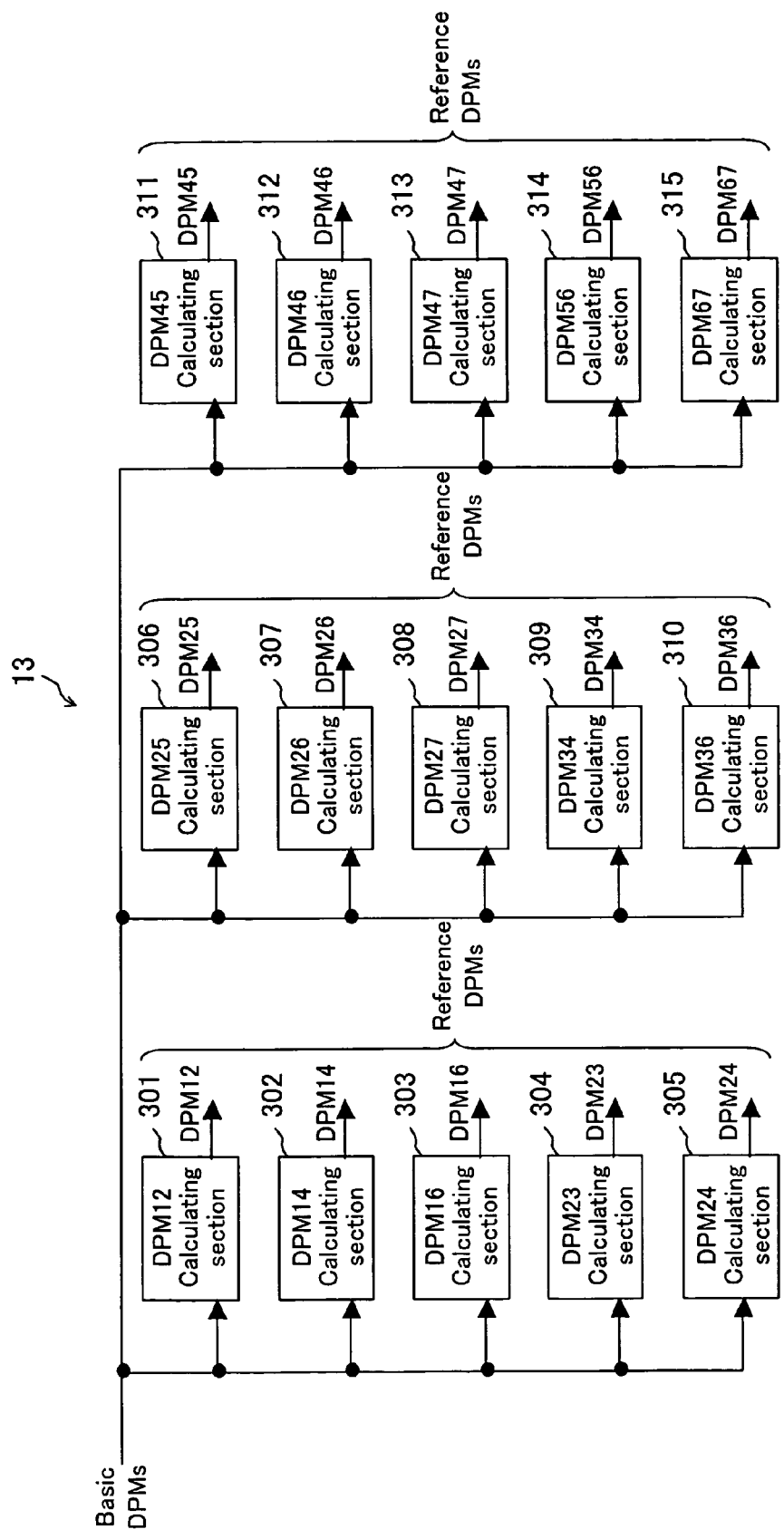
FIG. 3 illustrates the internal configuration of a reference DPM calculating section.

The reference DPM calculating section 13 calculates the reference DPMs from the basic DPMs retained in the basic DPM retaining section 11. FIG. 3 illustrates the internal configuration of the reference DPM calculating section 13. The reference DPM calculating section 13 includes a DPM12 calculating section 301 for calculating a DPM12, which is a reference DPM, a DPM14 calculating section 302 for calculating a DPM14, a DPM16 calculating section 303 for calculating a DPM16, a DPM23 calculating section 304 for calculating a DPM23, a DPM24 calculating section 305 for calculating a DPM24, a DPM25 calculating section 306 for calculating a DPM25, a DPM26 calculating section 307 for calculating a DPM26, a DPM27 calculating section 308 for calculating a DPM27, a DPM34 calculating section 309 for calculating a DPM34, a DPM36 calculating section 310 for calculating a DPM36, a DPM45 calculating section 311 for calculating a DPM45, a DPM46 calculating section 312 for calculating a DPM46, a DPM47 calculating section 313 for calculating a DPM47, a DPM56 calculating section 314 for calculating a DPM56, and a DPM67 calculating section 315 for calculating a DPM67. Each reference DPM is obtained as a difference between basic DPMs. That is, DPMij, which is a reference DPM, is expressed as $$DPMij=DPM0j-DPM0i.$$

The reference DPMs thus can be calculated without performing particularly complicated calculations. The reference DPMs necessary for the calculation of the basic DPMs will be described in detail later.

The basic DBM calculating section 14 receives a convolutionally encoded data sequence and outputs a difference between a specific pair of branch metrics. A branch metric is generally a square error between input data and its ideal value. To be specific, a branch metric is expressed as $$bij=(D-Yij)^2$$

where D represents input data and Yij indicates an ideal value. On the other hand, a DBM is expressed as $$DBM=bij-bkl=(D-Yij)^2-(D-Ykl)^2=(Ykl-Yij)(-Ykl-Yij+2\cdot D).$$

By the use of DBM, the squared term appearing in the branch metric calculation is thus deleted. In the above equations, since Ykl and Yij are constants, $$DBM=C0+C1\cdot D$$

where C0 and C1 are fixed values. In this manner, the basic DBM calculating section 14 calculates each basic DBM by performing one multiplication and one addition for the input data and is thus realized by a relatively simple circuit configuration. The basic DBMs required for the calculation of the basic DPMs will be described in detail later.

Figure 4:
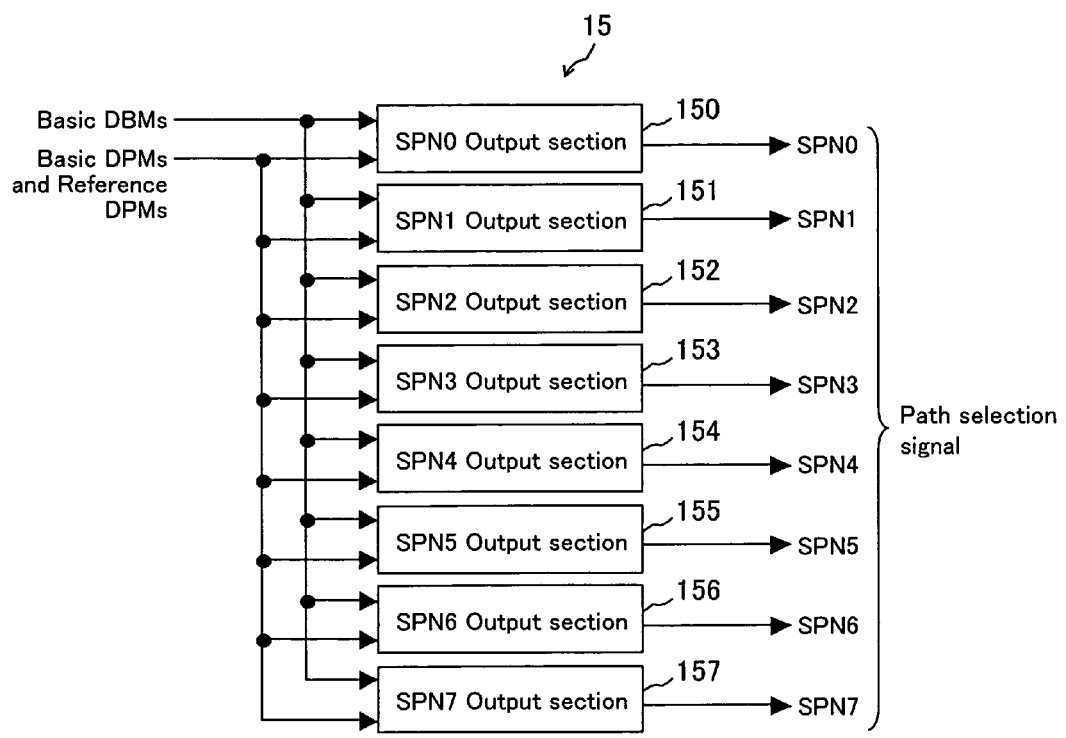
FIG. 4 illustrates the internal configuration of a path selecting section.

The path selecting section 15 receives the basic DBMs, the basic DPMs and the reference DPMs and outputs path selection signals each indicating the most likely branch for a state. FIG. 4 illustrates the internal configuration of the path selecting section 15. The path selecting section 15 includes, as path selection signal output sections, an SPN0 output section 150 for outputting a path selection signal SPN0 corresponding to the state S0, an SPN1 output section 151 for outputting a path selection signal SPN1 corresponding to the state S1, an SPN2 output section 152 for outputting a path selection signal SPN2 corresponding to the state S2, an SPN3 output section 153 for outputting a path selection signal SPN3 corresponding to the state S3, an SPN4 output section 154 for outputting a path selection signal SPN4 corresponding to the state S4, an SPN5 output section 155 for outputting a path selection signal SPN5 corresponding to the state S5, an SPN6 output section 156 for outputting a path selection signal SPN6 corresponding to the state S6, and an SPN7 output section 157 for outputting a path selection signal SPN7 corresponding to the state S7. In the trellis diagram shown in FIG. 10, to each of the eight states, a total of four branches coming from four states at the immediately preceding time are connected. The path selecting section 15 selects, for each of the states, the most likely branch from the four branches that are connected to that state and outputs a path selection signal that indicates the selected branch. Now, the SPN0 output section 150 will be discussed as an example of the path selection signal output sections. The other path selection signal output sections are configured in the same manner as the SPN0 output section 150.

Figure 5:
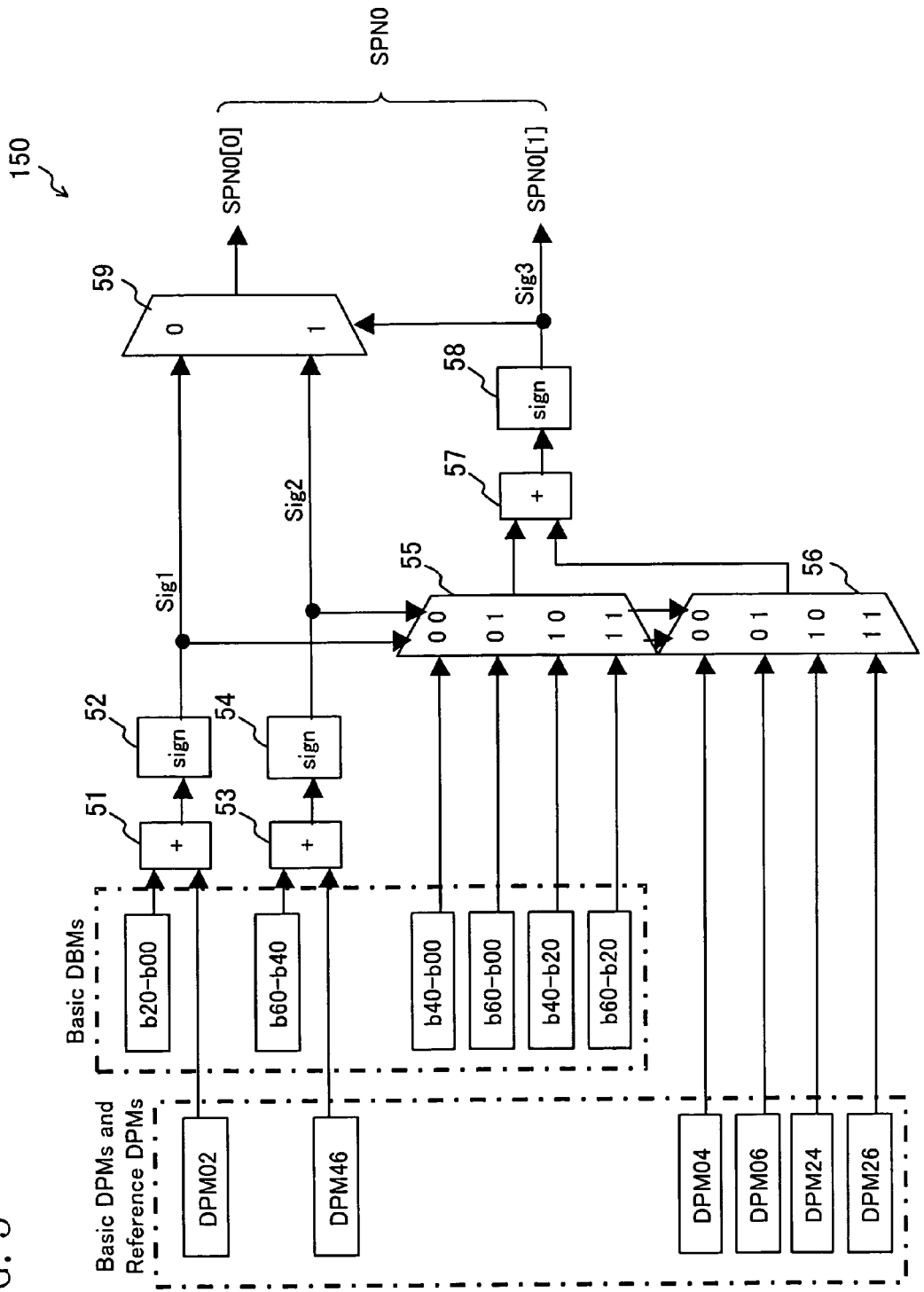
FIG. 5 illustrates the internal configuration of an SPN0 output section in the path selecting section.

FIG. 5 illustrates the internal configuration of the SPN0 output section 150. The SPN0 output section 150 assigns a 2-bit path selection number to each of the four branches related to a transition to the state S0 in the order of ascending state numbers of the transition-source states, and outputs this path selection number as the path selection signal SPN0 that corresponds to the state S0. Specifically, when the selection branch is b00, the path selection number is "0"; when the selection branch is b20, the path selection number is "1"; when the selection branch is b40, the path selection number is "2"; and when the selection branch is b60, the path selection number is "3".

An adder 51 adds the DPM02, which is a basic DPM, and (b20−b00), which is a basic DBM. That is, the adder 51 outputs the result produced by subtracting the path metric obtained when the branch whose path selection number is "0" is selected, from the path metric obtained when the branch whose path selection number is "1" is selected. A signal determination section 52 receives the result of the addition from the adder 51 and outputs a signal sig1, which is "1" when the addition result is a negative value, and "0" when the addition result is other than a negative value. Similarly, an adder 53 outputs the result produced by subtracting the path metric obtained when the branch whose path selection number is "2" is selected, from the path metric obtained when the branch whose path selection number is "3" is selected. A signal determination section 54 receives the result of the addition from the adder 53 and outputs a signal sig2, which is "1" when the addition result is a negative value, and "0" when the addition result is other than a negative value.

When the signals sig1 and sig2 are both "0", a selector 55 outputs the result obtained by subtracting the branch metric for the branch whose path selection number is "0" from the branch metric for the branch whose path selection number is "2". When the signal sig1 is "0" and the signal sig2 is "1", the selector 55 outputs the result obtained by subtracting the branch metric for the branch whose path selection number is "0" from the branch metric for the branch whose path selection number is "3". When the signal sig1 is "1" and the signal sig2 is "0", the selector 55 outputs the result obtained by subtracting the branch metric for the branch whose path selection number is "1" from the branch metric for the branch whose path selection number is "3". When the signals sig1 and sig2 are both "1", the selector 55 outputs the result obtained by subtracting the branch metric for the branch whose path selection number is "1" from the branch metric for the branch whose path selection number is "3".

When the signals sig1 and sig2 are both "0", a selector 56 outputs the DPM (the basic DPM04) obtained by subtracting the path metric for the state S0, which is the starting point of the branch whose path selection number is "0", from the path metric for the state S4, which is the starting point of the branch whose path selection number is "2". When the signal sig1 is "0" and the signal sig2 is "1", the selector 56 outputs the DPM (the basic DPM06) obtained by subtracting the path metric for the state S0, which is the starting point of the branch whose path selection number is "0", from the path metric for the state S6, which is the starting point of the branch whose path selection number is "3". When the signal sig1 is "1" and the signal sig2 is "0", the selector 56 outputs the DPM (the reference DPM24) obtained by subtracting the path metric for the state S2, which is the starting point of the branch whose path selection number is "1", from the path metric for the state S4, which is the starting point of the branch whose path selection number is "2". When the signals sig1 and sig2 are both "1", the selector 56 outputs the DPM (the reference DPM26) obtained by subtracting the path metric for the state S2, which is the starting point of the branch whose path selection number is "1", from the path metric for the state S6, which is the starting point of the branch whose path selection number is "3".

An adder 57 adds the output of the selector 55 and the output of the selector 56. A signal determination section 58 receives the result of the addition from the adder 57 and outputs a signal sig3, which is "1" when the addition result is a negative value, and "0" when the addition result is other than a negative value. A selector 59 outputs the signal sig1 when the signal sig3 is "0", and outputs the signal sig2 when the signal sig3 is "1". And the output of the selector 59 becomes the lower bit (SPN0[0]) of the path selection signal SPN0 and the signal sig3 becomes the higher bit (SPN0[1]) thereof.

In this embodiment, the path selection numbers are assigned to the branches connected to each state in the order of ascending state numbers of the transition-source states. However, the path selection numbers do not necessarily have to be generated in this order.

Next, the DPM01 calculating section 121 will be described as an example of the DPM0m calculating sections (m is an integer from 1 to 7) for calculating the basic DPMs in the basic DPM calculating section 12. The other DPM0m calculating sections are configured in the same manner as the DPM01 calculating section 121.

Before providing a description of the specific configuration of the DPM01 calculating section 121, generation of the DPM01 will be discussed. FIG. 6 shows rules for generating the basic DPMs at the time k. FIG. 6(a) shows rules for generating the DPM01 at the time k. The DPM01 (k), which is the DPM01 at the time k, is calculated as the sum of the DBM and the DPM (k−1) selected according to the path selection signals SPN0 and SPN1. For instance, when the path selection signals SPN0 and SPN1 are "0" and "1", respectively, $$DPM01(k)=(b21-b00)+DPM02(k-1).$$

The DPM (k−1) indicates the DPMs at the time (k−1), which is the time immediately before the time k. The basic DPMs other than the DPM01, i.e., the DPM02, the DPM03, the DPM04, the DPM05, the DPM06, and the DPM07, are generated according to the rules shown in FIGS. 6(b), 6(c), 6(d), 6(e), 6(f), and 6(g), respectively.

As already described, the DPMs that the ACS circuit of this embodiment retains are only the seven basic DPMs. The generation rules shown in FIG. 6, however, indicate that the calculations of the basic DPMs require DPMs other than the basic DPMs. It is the reference DPM calculating section 13 that calculates those DPMs other than the basic DPMs. As already mentioned, each reference DPM is easily calculated as a difference between basic DPMs. Furthermore, the reference DPMs necessary for the calculations of the basic DPMs are those at the time immediately before the time of the calculations of the basic DPMs. To be specific, to calculate new basic DPMs, the basic DBMs calculated by the basic DBM calculating section 14, the basic DPMs at the immediately preceding time that are retained by the basic DPM retaining section 11, and the reference DPMs each obtained by the reference DPM calculating section 13 as a difference between basic DPMs at the immediately preceding time may be used.

It is not necessary to calculate, as the reference DPMs, all of the DPMs other than the basic DPMs. In the case of the trellis diagram shown in FIG. 10, of the total of twenty-eight DPMs, seven DPMs are the basic DPMs and the other twenty-one DPMs can be the reference DPMs. Of these twenty-one DPMs, the reference DPMs that are actually needed are the fifteen DPMs shown in FIG. 3. Therefore, the other six DPMs do not have to be calculated. As to the DBMs, those that are necessary for the calculations of the basic DPMs, that is, only the basic DBMs, may be calculated.

Figure 7:
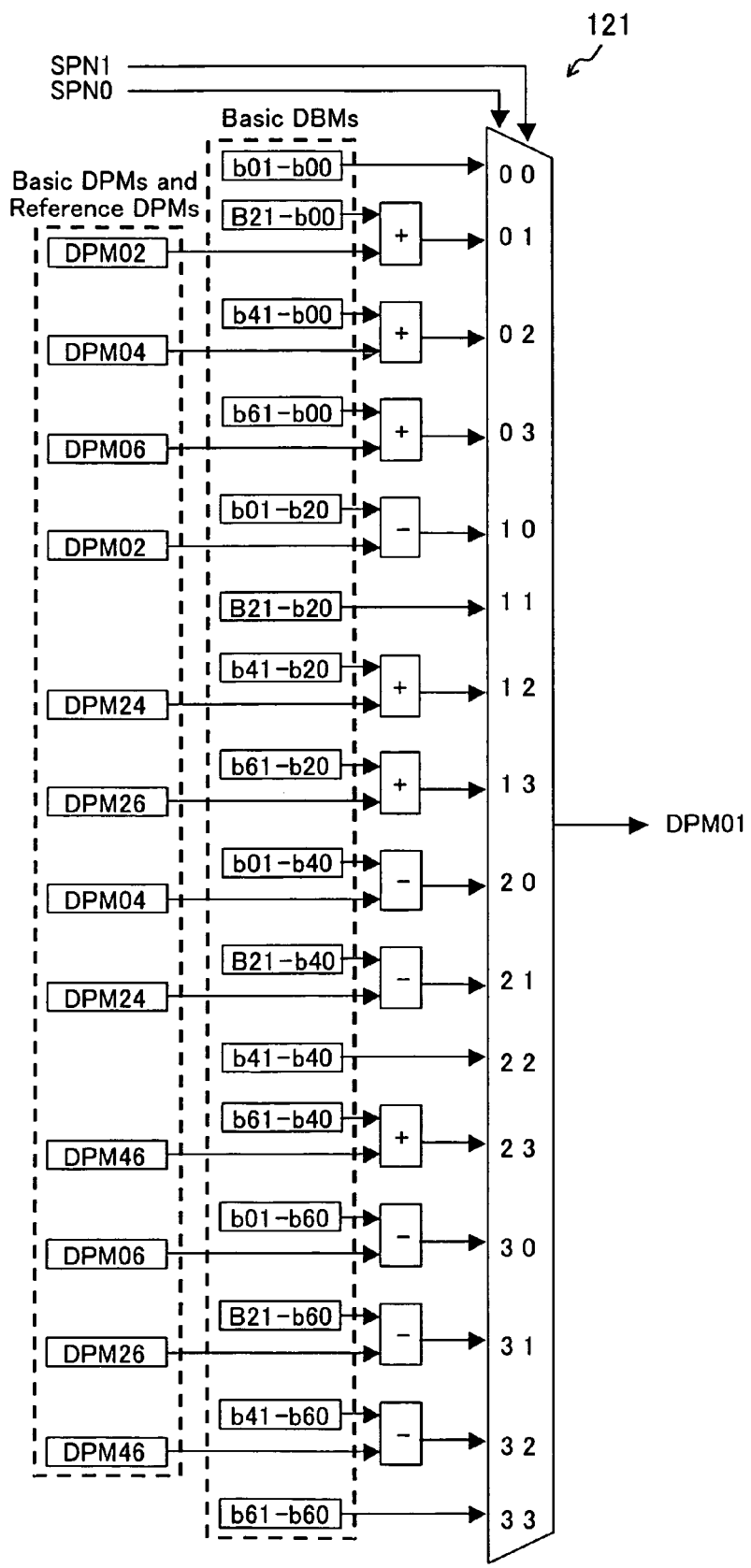
FIG. 7 illustrates the internal configuration of a DPM01 calculating section in the basic DPM calculating section.
Figure 8:
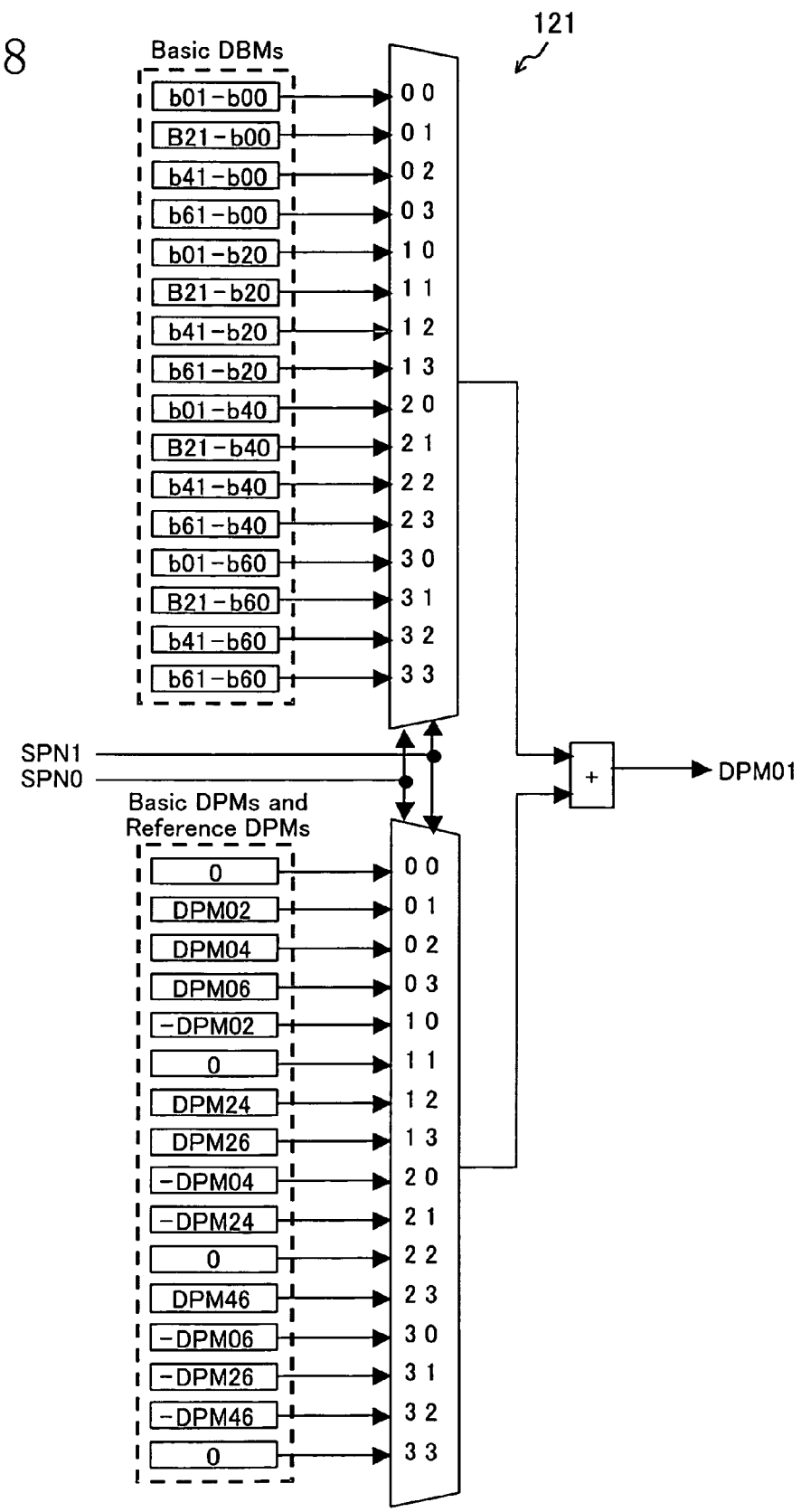
FIG. 8 illustrates the internal configuration of another DPM01 calculating section in the basic DPM calculating section.
Figure 9:
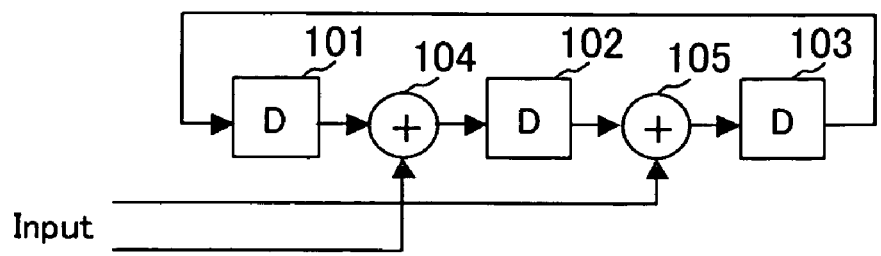
FIG. 9 shows the structure of a convolution encoder typically used in Gigabit Ethernet (Ethernet: trademark).

Next, the specific configuration of the DPM01 calculating section 121 will be discussed. FIG. 7 illustrates the internal configuration of the DPM01 calculating section 121. The DPM01 calculating section 121 calculates all possible values that can be candidates for the DPM01 in accordance with the generation rules shown in FIG. 6, selects one from the calculation results according to the path selection signals SPN0 and SPN1, and outputs the selected result. FIG. 8 illustrates the internal configuration of another DPM01 calculating section 121 having a different configuration from the configuration shown in FIG. 7. The DPM01 calculating section 121 shown in FIG. 8 selects a DBM and a DPM required for the calculation of the DPM01 according to the path selection signals SPN0 and SPN1, adds the selected DBM and DPM, and outputs the result.

As described above, in this embodiment, since only the basic DPMs are retained, the retaining circuit is reduced in size as compared with the conventional circuit. Furthermore, as to the DPMs, it is sufficient if just the basic DPMs and the reference DPMs are calculated. Therefore, the number of adders required for the DPM calculation is smaller than that in the conventional circuit. Specifically, in the case of the trellis diagram shown in FIG. 10, the conventional ACS circuit needs to retain the twenty-eight DPMs, while the ACS circuit of this embodiment needs to retain only seven DPMs (the basic DPMs). Also, in the conventional ACS circuit, 400 adders are necessary for the DPM calculation. In the ACS circuit of this embodiment, on the other hand, the number of necessary adders (including subtractors) is 115, which is the sum of 100 adders for calculating the basic DPMs and 15 subtractors for calculating the reference DPMs. Moreover, if the DPM0m calculating section shown in FIG. 8 is adopted, the number of adders is reduced to 25.

As compared with the conventional ACS circuit, the ACS circuit of this embodiment first calculates the basic DPMs and then calculates the reference DPMs. Therefore, it may seem that in the ACS circuit of this embodiment the processing time will be increased by the reference DPM calculation. However, the time at which the basic DPM (k) and the reference DPM (k) at the time k are actually necessary is the time at which new basic DPMs at the time (k+1) are calculated. Therefore, the reference DPMs at the time k may be calculated simultaneously with the calculation of the basic DBMs at the time (k+1). In other words, the reference DBM calculating section 14 and the reference DPM calculating section 13 may be operated in parallel. Then, the reference DPM calculation will not cause increase in the processing time.

Also, in the foregoing descriptions, the state S0 is the reference state, but any other states may be the reference.

INDUSTRIAL APPLICABILITY

As described above, the ACS circuit according to the present invention, in which a measure to prevent a path metric overflow occurring in Viterbi decoding is taken while a relatively small circuit size and a relatively high processing rate are maintained, is applicable to error correction techniques in read channel systems in communications, optical disks, and magnetic disks.

The invention claimed is:

1. An ACS circuit, which receives differential branch metrics (hereinafter referred to as "DBMs"), each of which is a difference between any two branches related to Viterbi decoding, performs additions of the received DBMs to differential path metrics (hereinafter referred to as "DPMs"), each of which is a difference between any two states, and compares resultant DPMs obtained after the additions to select the most likely paths,
   wherein of the DPMs, basic DPMs, each of which is a differential path metric between a path metric for a reference state and a path metric for another state, are retained and the most likely paths are selected according to the basic DPMs.

2. The ACS circuit of claim 1, comprising:
   a basic DPM retaining section for retaining the basic DPMs;
   a basic DPM calculating section for calculating the basic DPMs;
   a reference DPM calculating section for calculating reference DPMs, which are DPMs other than the basic DPMs and necessary for the basic DPM calculation by the basic DPM calculating section;
   a basic DBM calculating section for calculating basic DBMs of the DBMs, the basic DBMs being necessary for the basic DPM calculation by the basic DPM calculating section; and
   a path selecting section for selecting the most likely paths for the Viterbi decoding in accordance with the basic DPMs retained by the basic DPM retaining section, the reference DPMs calculated by the reference DPM calculating section, and the basic DBMs calculated by the basic DBM calculating section,
   wherein the basic DPM calculating section calculates new basic DPMs in accordance with the basic DPMs retained by the basic DPM retaining section, the reference DPMs calculated by the reference DPM calculating section, the basic DBMs calculated by the basic DBM calculating section, and results of the most likely path selection by the path selecting section.

3. The ACS circuit of claim 2, wherein the basic DBM calculation by the basic DBM calculating section and the reference DPM calculation by the reference DPM calculating section are performed by parallel processing.

4. The ACS circuit of claim 2, wherein the reference DPM calculating section calculates each of the reference DPMs by subtracting one of the basic DPMs retained by the basic DPM retaining section from another.

5. The ACS circuit of claim 2, wherein the basic DPM calculating section selects basic DPMs and basic DBMs, from which the new basic DPMs are calculated, from the basic DPMs retained by the basic DPM retaining section, the reference DPMs calculated by the reference DPM calculating section, and the basic DBMs calculated by the basic DBM calculating section, in accordance with the results of the most likely path selection by the path selecting section, and performs additions of the selected basic DPMs and the selected basic DBMs, thereby calculating the new basic DPMs.

6. The ACS circuit of claim 2, wherein the basic DPM calculating section adds each of the basic DPMs retained by the basic DPM retaining section and the reference DPMs calculated by the reference DPM calculating section to each of the basic DBMs calculated by the basic DBM calculating section to thereby calculate candidates for the new basic DPMs and selects the new basic DPMs from the candidates in accordance with the results of the most likely path selection by the path selecting section.

7. The ACS circuit of claim 2, wherein the path selecting section assigns different path selection numbers to branches related to transitions to states in the viterbi decoding and outputs, as the results of the most likely path selection, a path selection signal indicating one of the path selection numbers.

8. The ACS circuit of claim 1, wherein only the basic DPMs are retained.

* * * * *